United States Patent
Park (10) Patent No.: US 12,104,638 B2
(45) Date of Patent: Oct. 1, 2024

(54) INTERLOCKING FASTENING UPPER ELECTRODE ASSEMBLY HAVING IMPROVED FASTENING FORCE, AND PLASMA DEVICE INCLUDING SAME

(71) Applicant: TEM CO., LTD., Cheonan-si (KR)

(72) Inventor: Jin Kyung Park, Cheonan-si (KR)

(73) Assignee: TEM CO., LTD., Cheonan-si (KR)

( * ) Notice: Subject to any disclaimer, the term of this patent is extended or adjusted under 35 U.S.C. 154(b) by 202 days.

(21) Appl. No.: 17/906,021

(22) PCT Filed: Feb. 15, 2021

(86) PCT No.: PCT/KR2021/001860
§ 371 (c)(1),
(2) Date: Sep. 9, 2022

(87) PCT Pub. No.: WO2021/187756
PCT Pub. Date: Sep. 23, 2021

(65) Prior Publication Data
US 2023/0032767 A1    Feb. 2, 2023

(30) Foreign Application Priority Data
Mar. 20, 2020   (KR) .................. 10-2020-0034609

(51) Int. Cl.
| | | |
|---|---|---|
| F16B 39/12 | (2006.01) | |
| F16B 39/26 | (2006.01) | |
| H01J 37/32 | (2006.01) | |

(52) U.S. Cl.
CPC .............. *F16B 39/12* (2013.01); *F16B 39/26* (2013.01); *H01J 37/3255* (2013.01); *H01J 37/32568* (2013.01); *H01J 2237/032* (2013.01)

(58) Field of Classification Search
CPC ..... F16B 39/26; F16B 39/12; H01J 2237/032; H01J 37/3255; H01J 37/32568
(Continued)

(56) References Cited

U.S. PATENT DOCUMENTS 3,308,587 A * 3/1967 Gilroy ................ A63D 1/04
52/126.5
9,117,623 B1 * 8/2015 Borges ................ H01J 37/3171
(Continued)

FOREIGN PATENT DOCUMENTS

| JP | 2004-211854 A | 7/2004 |
| KR | 20-0391188 Y1 | 7/2005 |

(Continued)

OTHER PUBLICATIONS

International Search Report issued in PCT/KR2021/001860; mailed May 21, 2021.

*Primary Examiner* — Gary W Estremsky
(74) *Attorney, Agent, or Firm* — Studebaker & Brackett PC (57) ABSTRACT

An interlocking fastening upper electrode assembly having an improved fastening force is proposed. The assembly is configured such that a bush inserted into a silicon electrode protrudes above the silicon electrode, and the protruding portion is inserted into and coupled to an anodizing plate so as to suppress rotation of the bush, the assembly including: an inner and outer tab composite nut coupled to an assembly groove of the silicon electrode and an anodizing plate so as to prevent rotation; an inner and outer tab nut assembled in the assembly groove of the silicon electrode and fitted to the outside of the inner and outer tab composite nut; and an assembly module coupled through the inside of a through part of the anodizing plate and assembled with the inner and outer tab composite nut in order to fix the anodizing plate provided above the silicon electrode.

10 Claims, 5 Drawing Sheets

(58) Field of Classification Search
USPC .......................................................... 411/222
See application file for complete search history.

(56) References Cited

U.S. PATENT DOCUMENTS

| | | | | |
|---|---|---|---|---|
| 2005/0025607 A1* | 2/2005 | Guantonio | .............. | F16B 39/12 |
| | | | | 411/222 |
| 2008/0087641 A1* | 4/2008 | De La Llera | ..... | H01J 37/32541 |
| | | | | 438/689 |
| 2008/0236751 A1* | 10/2008 | Aramaki | ........... | H01J 37/32192 |
| | | | | 156/345.43 |
| 2009/0095424 A1* | 4/2009 | Bettencourt | ........ | C23C 16/4401 |
| | | | | 156/345.34 |
| 2010/0038033 A1* | 2/2010 | Hardin | ................ | H01J 37/3255 |
| | | | | 204/298.07 |
| 2011/0070740 A1* | 3/2011 | Bettencourt | ........ | H01J 37/3244 |
| | | | | 118/723 MP |
| 2011/0206479 A1* | 8/2011 | Sexton | ............. | H01J 37/32908 |
| | | | | 411/395 |
| 2012/0052370 A1* | 3/2012 | Moon | .................. | H01M 50/55 |
| | | | | 429/179 |
| 2020/0144033 A1* | 5/2020 | Ji | ........................ | H01J 37/3255 |

FOREIGN PATENT DOCUMENTS

| KR | 10-2011-0091253 A | 8/2011 |
|---|---|---|
| KR | 10-1593920 B1 | 2/2016 |
| KR | 10-1980255 B1 | 5/2019 |
| KR | 10-2076311 B1 | 2/2020 |
| KR | 10-2115385 B1 | 5/2020 |

* cited by examiner

INTERLOCKING FASTENING UPPER ELECTRODE ASSEMBLY HAVING IMPROVED FASTENING FORCE, AND PLASMA DEVICE INCLUDING SAME

CROSS-REFERENCE TO RELATED APPLICATIONS

This application is a U.S. National Phase Entry of International Application No. PCT/KR2021/001860 filed on Feb. 15, 2021, which claims the benefit of priority to Korean Patent Application No. 10-2020-0034609 filed on Mar. 20, 2020, the entire content of which is incorporated herein by reference.

TECHNICAL FIELD

The present disclosure relates to an interlocking fastening upper electrode assembly having an improved fastening force. More particularly, the present disclosure relates to an interlocking fastening upper electrode assembly having an improved fastening force and a plasma device including the same, the assembly being configured to restrain rotation a bush, which is inserted into a silicon electrode and protrudes above the silicon electrode so that a protruding portion of the bush is inserted into and coupled to an anodizing plate.

BACKGROUND ART

In general, a plasma device used for etching processing of semiconductor wafers includes a cathode installed in parallel to a wafer positioned on an anode inside a plasma chamber, receiving a reaction gas injected through a plurality of holes formed thereon, generating plasma used for the etching of the semiconductor wafers with applying a high-frequency voltage.

The conventional cathode is coupled on a plate inside the plasma chamber through a bolt, and in bolt-fastening, a plurality of bolt insertion holes having a screw thread therein is formed in each of the cathode and the plate in the chamber, and the respective bolt insertion holes match vertically and then the bolt is inserted into the holes to couple the cathode to the plate.

In the bolt-fastening structure, a bolt fastening tool damages the screw thread by movement of the bolt generated in high-pressure plasma environment, causing a problem of consumption of expensive cathodes and, in addition, a gap is generated between the cathode and the plate by releasing of screw-coupling, causing a problem of degrading the performance of the wafer etching process.

Meanwhile, as a method for solving the above problem, a circular through hole is formed in the cathode, a bush inserted into the through hole while being fixed by a step, and an assembly ring inserted between the outside space of the bush and the inside space of the through hole of the cathode are provided, and then an assembly screw connected to the plate of the plasma chamber is coupled to the bush in a screwing manner, so that damage to a screw joint is suppressed, and when damage occurs, a configuration in which only the damaged bush is replaced is applied.

However, in the above configuration, there is a problem in that the bush inserted in the through hole of the cathode moves and is damaged by a contact with a side portion of the thorough hole. As with the general bolted structure, there is still a problem in that the etch performance is deteriorated because the bush moves in the wafer etching process and the screw coupling between the assembly screw and the bush is released to generate a gap between the cathode and the plate.

DISCLOSURE

Technical Problem

Accordingly, the present disclosure has been made keeping in mind the above problems occurring in the related art, and an objective of the present disclosure is intended to provide an interlocking fastening upper electrode assembly having an improved fastening force, wherein the assembly is configured such that a polygonal rotation prevention part formed on an upper portion of an inner and outer tab composite nut, the rotation prevention part being inserted into a silicon electrode and connected to a clamp bolt to connect an anodizing plate to the silicon electrode, protrudes above the silicon electrode so as to be inserted into and coupled to the anodizing plate, so that rotation of the inner and outer tab composite nut is preventable and a gap is generated inside the anodizing plate, thereby minimizing a load and improving the productivity thereof.

Technical Solution

In order to achieve the above objective, according to an embodiment of the present disclosure, there is provided an interlocking fastening upper electrode assembly having an improved fastening force, the assembly including: an inner and outer tab composite nut coupled to an assembly groove of a silicon electrode and an anodizing plate so as to prevent rotation; an inner and outer tab nut assembled into the assembly groove of the silicon electrode and fitted around the inner and outer tab composite nut; and an assembly module coupled through an inner portion of a through part of the anodizing plate and assembled with the inner and outer tab composite nut in order to fix the anodizing plate provided above the silicon electrode.

The inner and outer tab composite nut may include: an insertion part inserted into the assembly groove below the inner and outer tab composite nut to be in close contact with an inner surface of the assembly groove; a fastening part extended above the insertion part and comprising a tap so as to be fastened to the inner and outer tab nut; a rotation prevention part located on the fastening part and coupled to the through part of the anodizing plate to prevent rotation of the inner and outer tab composite nut; and a fastening groove having a screw thread so as to allow the assembly module to be fastened through the rotation prevention part.

The rotation prevention part may protrude above the silicon electrode and may be inserted into the anodizing plate assembled by the assembly module, and the rotation prevention part may have a polygonal shape of a triangular shape or a hexagonal shape so as to prevent rotation of the inner and outer tab composite nut.

A gap may be generated in the through part to be located around the rotation prevention part, the gap being an empty space remaining after the rotation prevention part is coupled to the through part.

The inner and outer tab nut may include a tap on an outer portion thereof so as to be fastened into the assembly groove of the silicon electrode, and the inner and outer tab nut may have a coupling groove having a screw thread therein so that the inner and outer tab composite nut may be coupled thereto through upper and lower ends thereof.

The assembly module may include: a clamp bolt inserted into the through part of the anodizing plate and fastened to the inner and outer tab composite nut; a ring washer provided outside the clamp bolt and fitted into the through part of the anodizing plate; a spring washer fitted around the clamp bolt and located above the ring washer; and a plurality of a first releasing prevention washer and a second releasing prevention washer that may be located above the spring washer and prevent releasing of the clamp bolt.

A plurality of seating grooves may be formed on an upper portion of the first releasing prevention washer at predetermined intervals, and a plurality of seating protrusions may be provided on a lower portion of the second releasing prevention washer to be seated into the respective seating grooves.

As another embodiment of the present disclosure, there may be a plasma device including an interlocking fastening electrode assembly having an improved fastening force, the electrode assembly coupling an anodizing plate to a silicon electrode, wherein the electrode assembly may include: an inner and outer tab composite nut, an inner and outer tab nut, and an assembly module.

The inner and outer tab composite nut may include: an insertion part inserted into an assembly groove of the silicon electrode to be in close contact with an inner surface of a bottom surface of the assembly groove; a fastening part extended above the insertion part and comprising a tap formed on an outer portion thereof; and a rotation prevention part provided on the fastening part and inserted into the through part of the anodizing plate.

The inner and outer tab nut may be fitted around the inner and outer tab composite nut, and assembled to the assembly groove of the silicon electrode.

The assembly module coupled through an inside space of the through part of the anodizing plate and assembled to the inner and outer tab composite nut, so that the anodizing plate may be fixed to the silicon electrode.

The inner and outer tab composite nut may have a fastening groove having a screw thread so as to allow the assembly module to be fastened through the rotation prevention part.

The rotation prevention part may protrude above the silicon electrode and may be inserted into the anodizing plate and may have a polygonal shape of a triangular shape or a hexagonal shape so as to prevent rotation of the inner and outer tab composite nut.

A gap may be provided in the through part of the anodizing plate to be around the rotation prevention part, and the gap may be an empty space remaining after the rotation prevention part is coupled to the through part of the anodizing plate.

The inner and outer tab nut may include a tap on an outer portion thereof so as to be fastened into the assembly groove of the silicon electrode, and the inner and outer tab nut may include a coupling groove having a screw thread formed therein so as to allow the inner and outer tab composite nut to be coupled through upper and lower ends thereof.

The assembly module may include: a clamp bolt inserted into the through part of the anodizing plate and fastened to the inner and outer tab composite nut; a ring washer provided outside the clamp bolt and fitted into the through part of the anodizing plate; a spring washer fitted around the clamp bolt and located above the ring washer; and a plurality of a first releasing prevention washer and a second releasing prevention washer that may be located above the spring washer and may prevent releasing of the clamp bolt.

A width of the gap that may be the empty space remaining after the rotation prevention part is coupled to the through part is ranged from 0.1 to 0.3 mm.

Advantageous Effects

As described above, according to the interlocking fastening upper electrode assembly having the improved fastening force of the present disclosure, when the inner and outer tab composite nut to which the clamp bolt inserted into the anodizing plate to connect the silicon electrode to the anodizing plate is fastened is fastened to the silicon electrode, the inner and outer tab composite nut protrudes upward and the polygonal rotation prevention part is inserted into and coupled to the through part of the anodizing plate, so that rotation of the inner and outer tab composite nut is prevented. Therefore, the silicon electrode and the anodizing plate can be stably coupled to each other and productivity and user satisfaction thereof can be maximized.

DESCRIPTION OF REFERENCE NUMERALS

10: silicon electrode 11: assembly groove
20: anodizing plate 21: through part
100: inner and outer tab composite nut 110: insertion part
120: fastening part 130: rotation prevention part
140: fastening groove 200: inner and outer tab nut
210: coupling groove 220: rotation grooves
300: assembly module 310: clamp bolt
311: body part 312: head part
312a: tool insertion groove 320: ring washer
330: spring washer 340: first releasing prevention washer
341: seating grooves 350: second releasing prevention washer
351: seating protrusions S: gap
T1, T2: tap

MODE FOR INVENTION

The present disclosure may be variously modified and may have various exemplary embodiments, so examples of which are illustrated in the accompanying drawings and will be described in detail with reference to the accompanying drawings. However, it should be understood that the present disclosure is not limited to specific embodiments, but various modifications, equivalents, additions and substitutions included in the scope and spirit of the prevent disclosure are included in the present disclosure.

In the accompanying drawings, the embodiments of the present disclosure may not be limited to shown specific shapes and may be exaggeratedly drawn to clearly comprehend the present disclosure. It should be understood that the specific terminology used herein is for the purpose of describing the present disclosure and is not intended to limit the meaning of elements or to limit the scope and sprit of the present disclosure described in the claims.

As used herein, the singular forms "a", "an" and "the" are intended to include the plural forms as well, unless the context clearly indicates otherwise. Furthermore, elements, steps, and operations referred to as "include" or "including" mean the presence or addition of one or more other elements, steps, and operations. As used herein, the singular forms "a", "an" and "the" are intended to include the plural forms as well, unless the context clearly indicates otherwise. Furthermore, elements, steps, operations, and devices referred to as "include" or "including" mean the presence or addition of one or more other elements, steps, operations, and devices.

Furthermore, terms such as "a first term and a second term" may be used for explaining various constitutive elements, but the order or other features between the constitutive elements should not be limited to these terms.

In the description of the embodiments, descriptions that each layer (film), region, pattern, or structure is formed "on" or "under" a substrate, each side (film), region, pad, or patterns includes both "is directly formed" and "formed with another layer interposed therebetween". The criteria for "on/above" or "under/below" of each layer will be described with reference to the accompanying drawings.

Hereinbelow, exemplary embodiments of the present disclosure will be described in detail with reference to accompanying drawings.

Figure 1:
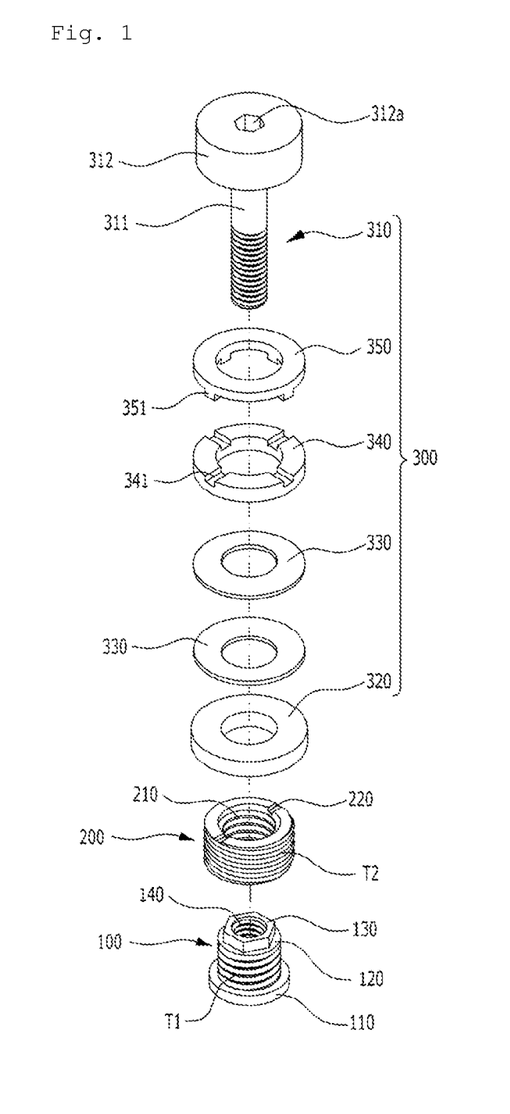
FIG. 1 is an exploded-perspective view showing an interlocking fastening upper electrode assembly having an improved fastening force according to the present disclosure.
Figure 2:
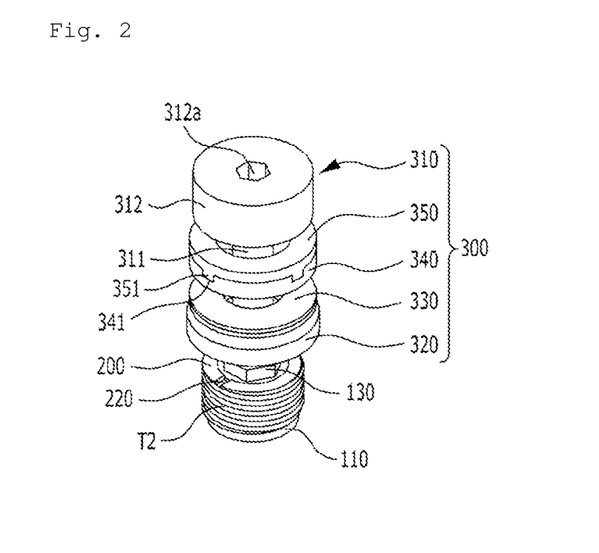
FIG. 2 is a coupling-perspective view showing the interlocking fastening upper electrode assembly having the improved fastening force according to the present disclosure.
Figure 3:
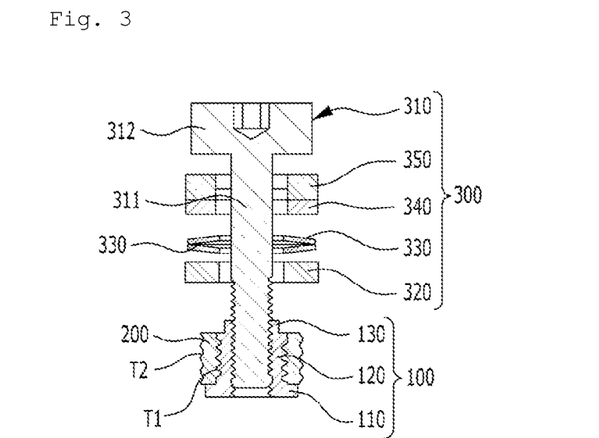
FIG. 3 is a sectional view showing the interlocking fastening upper electrode assembly having the improved fastening force according to the present disclosure.
Figure 4:
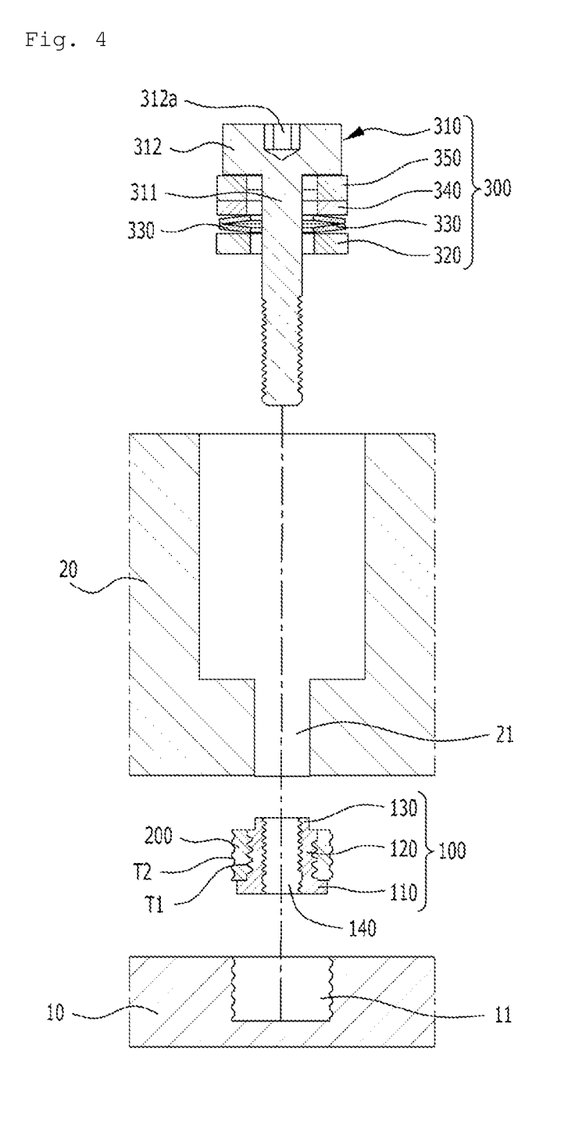
FIG. 4 is a sectional view showing a pre-installation state of the interlocking fastening upper electrode assembly having the fastening force according to the present disclosure.
Figure 5:
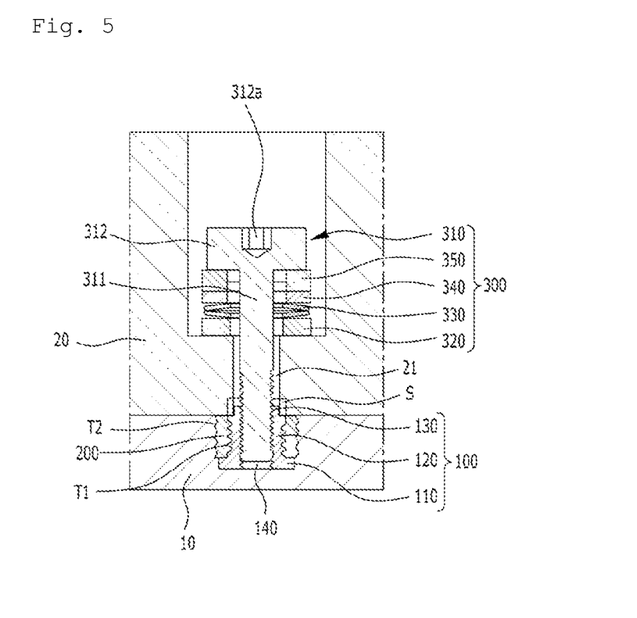
FIG. 5 is a sectional view showing an installation state or the interlocking fastening upper electrode assembly having the improved fastening force according to the present disclosure.
Figure 6:
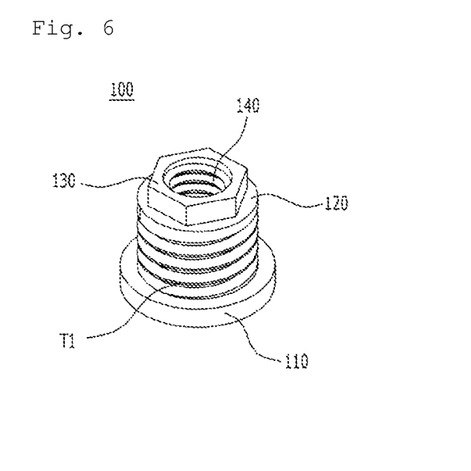
FIG. 6 is an enlarged-perspective view showing an inner and outer tab composite nut of the interlocking fastening upper electrode assembly having the improved fastening force according to the present disclosure.
Figure 7:
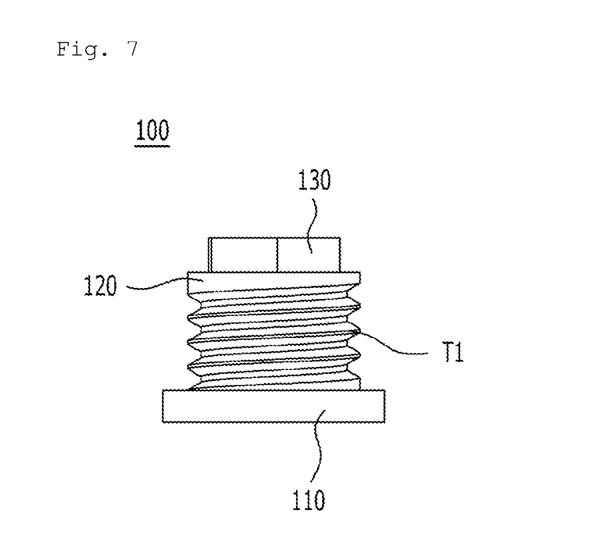
FIG. 7 is a front view showing the inner and outer tab composite nut according to FIG. 6.
Figure 8:
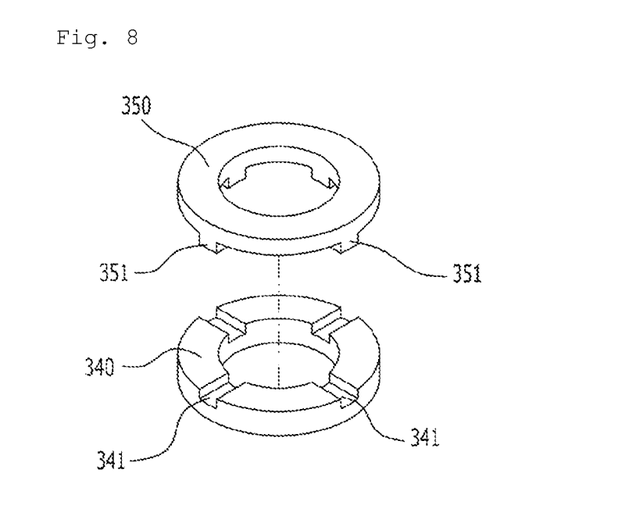
FIG. 8 is an enlarged-perspective view showing a first releasing prevention washer and a second releasing prevention washer of the interlocking fastening upper electrode assembly having the improved fastening force according to the present disclosure.

FIG. 1 is an exploded-perspective view showing an interlocking fastening upper electrode assembly having an improved fastening force according to the present disclosure. FIG. 2 is a coupling-perspective view showing the interlocking fastening upper electrode assembly having the improved fastening force according to the present disclosure. FIG. 3 is a sectional view showing the interlocking fastening upper electrode assembly having the improved fastening force according to the present disclosure. FIG. 4 is a sectional view showing a pre-installation state of the interlocking fastening upper electrode assembly having the fastening force according to the present disclosure. FIG. 5 is a sectional view showing an installation state or the interlocking fastening upper electrode assembly having the improved fastening force according to the present disclosure. FIG. 6 is an enlarged-perspective view showing an inner and outer tab composite nut of the interlocking fastening upper electrode assembly having the improved fastening force according to the present disclosure. FIG. 7 is a front view showing the inner and outer tab composite nut according to FIG. 6. FIG. 8 is an enlarged-perspective view showing a first releasing prevention washer and a second releasing prevention washer of the interlocking fastening upper electrode assembly having the improved fastening force according to the present disclosure.

As shown in FIGS. 1 to 8, the interlocking fastening upper electrode assembly having an improved fastening force according to the present disclosure includes an inner and outer tab composite nut 100, an inner and outer tab nut 200, and an assembly module 300.

The inner and outer tab composite nut 100 is fastened into an assembly groove 11 of a silicon electrode 10 and an upper portion thereof may be inserted into and coupled to a through part 21 of an anodizing plate 20.

The inner and outer tab composite nut 100 includes an insertion part 110 inserted into the assembly groove 11 to be in close contact with an inside surface of the bottom of the assembly groove 11 of the silicon electrode 10. The inner and outer tab composite nut 100 includes a fastening part 120 extended above the insertion part 110 and having a tap T1 at an outer portion thereof to be fastened to an inner portion of the inner and outer tab nut 200.

In other words, the insertion part 110 is inserted into the assembly groove 11 and placed on the bottom surface of the assembly groove 11, is stably inserted into the assembly groove 11 while being in close contact with the inner surface without shaking, and when the inner and outer tab nut 200 is fastened into the assembly groove 11 in a state in which the inner and outer tab composite nut 100 is inserted into the assembly groove 11, the inner and outer tab nut 200 may be coupled to the fastening part 120.

Furthermore, a rotation prevention part 130 may be provided on an upper portion of the fastening part 120 so as to be coupled to the through part 21 of the anodizing plate 20

When the inner and outer tab composite nut 100 is inserted into the assembly groove 11 of the silicon electrode 10, the rotation prevention part 130 is provided to protrude above the silicon electrode 10 so as to be coupled to the through part 21 of the anodizing plate 20.

Furthermore, the rotation prevention part 130 is inserted into the through part 21 of the anodizing plate 20, and has a polygonal shape of an oval shape, a triangular shape, a hexagonal shape, etc. to prevent rotation of the inner and outer tab composite nut 100.

In other words, when the anodizing plate 20 is in close contact with an upper portion of the silicon electrode 10 with the insertion part 110 and the fastening part 120 inserted in the assembly groove 11 of the silicon electrode 10, the rotation prevention part 130 is inserted into the through part 21 of the anodizing plate 20, and as the rotation prevention part 130 has a polygonal shape, rotation of the inner and outer tab composite nut 100 as well as rotation of the assembly module 300 can be prevented, so that the silicon electrode 10 and the anodizing plate 20 are stably connected to each other.

In addition, the through part 21 at a location where the rotation prevention part 130 is inserted may have the same shape as the external shape of the rotation prevention part 130.

Furthermore, as shown in FIG. 5, the through part 21 into which the rotation prevention part 130 is inserted may have a gap S that is an empty space provided such that the rotation prevention part 130 is inserted into the through part 21 and a predetermined space is remained.

The gap S may be ranged from 0.1 mm to 0.3 mm.

A fastening groove 140 having a screw thread may be formed at a center portion of the inner and outer tab composite nut 100, so that a clamp bolt 310 of the assembly module 300, which will be described below, may be fastened through the rotation prevention part 130 to assemble the silicon electrode 10 and the anodizing plate 20 together.

The inner and outer tab nut 200 is assembled into the assembly groove 11 of the silicon electrode 10 and is assembled to the inner and outer tab composite nut 100 by being fitted around an outer portion of the inner and outer tab composite nut 100.

Furthermore, the inner and outer tab nut 200 may have a tap T2 at an outer portion thereof so as to be fastened into the assembly groove 11 of the silicon electrode 10.

In addition, a coupling groove 210 having a screw thread may be formed inside the inner and outer tab nut 200 so that the inner and outer tab composite nut 100 may be coupled to the inner and outer tab nut 200 through upper and lower ends of the inner and outer tab nut 200.

Furthermore, in order to assemble the inner and outer tab nut 200 to the inner and outer tab composite nut 100 and the assembly groove 11, rotation grooves 220 may be formed on opposite portions of an upper portion of the inner and outer tab nut 200 so as to rotate the inner and outer tab nut 200 by a fastening tool (not shown).

In other words, when the inner and outer tab composite nut 100 is inserted into the assembly groove 11 of the silicon electrode 10, the inner and outer tab nut 200 is fastened into the assembly groove 11, and the inner and outer tab nut 200 may be assembled between the inner and outer tab composite nut 100 and the assembly groove 11 so as to prevent separation of the inner and outer tab composite nut 100.

The assembly module 300 is assembled with the inner and outer tab composite nut 100 through the through part 21 of the anodizing plate 20 in order to fix the anodizing plate 20 provided above the silicon electrode 10.

The assembly module 300 includes the clamp bolt 310, a ring washer 320, a spring washer 330, a first releasing prevention washer 340, and a second releasing prevention washer 350.

The clamp bolt 310 may be inserted into the through part 21 of the anodizing plate 20 and be fastened to the inner and outer tab composite nut 100.

The clamp bolt 310 may include a body part 311 having a screw thread so as to be fastened to the fastening groove 140 having the screw thread of the inner and outer tab composite nut 100, and a head part 312 provided above the body part 311 and fasten the clamp bolt 310 to the inner and outer tab composite nut 100.

Furthermore, a tool insertion groove 312a into which the fastening tool (not shown) may be formed on an inner surface of an upper portion of the head part 312, so that the clamp bolt 310 may be fastened into the fastening groove 140 through the through part 21 with the inner and outer tab nut 200 and the inner and outer tab composite nut 100 assembled to each other.

The ring washer 320 is provided outside the clamp bolt 310, is inserted into the through part 21 of the anodizing plate 20, and is fitted around an outer portion of the clamp bolt 310.

The spring washer 330 may be fitted around the outer portion of the clamp bolt 310 and may be located above the ring washer 320.

Furthermore, the spring washer 330 may include a plurality of spring washers 330 vertically overlapped with each other.

The first releasing prevention washer 340 is located above the spring washer 330 so as to prevent releasing of the clamp bolt 310 fastened to the inner and outer tab composite nut 100 through the through part 21 of the anodizing plate 20.

Furthermore, a plurality of seating grooves 341 may be formed on an upper portion of the first releasing prevention washer 340 at predetermined intervals.

The second releasing prevention washer 350 may be provided to be in close contact with the upper portion of the first releasing prevention washer 340.

Furthermore, seating protrusions 351 may be provided at a lower portion of the second releasing prevention washer 350 so that the second releasing prevention washer 350 may be seated in the respective seating grooves 341 of the first releasing prevention washer 340.

An operation state of the interlocking fastening upper electrode assembly having the improved fastening force of the present disclosure configured with the above-described structure will be described below.

The inner and outer tab composite nut 100 and the inner and outer tab nut 200 are assembled into the assembly groove 11 of the silicon electrode 10, and the rotation prevention part 130 is located higher than a surface level of the silicon electrode 10 above the assembly groove 11 of the silicon electrode 10, so that the rotation prevention part 130 protrudes above the silicon electrode 10 and thus the inner and outer tab composite nut 100 may be assembled to the assembly groove 11.

In addition, the inner and outer tab composite nut 100 and the inner and outer tab nut 200 are assembled into the assembly groove 11 of the silicon electrode 10 and the anodizing plate 20 is brought into close contact with the upper portion of the silicon electrode 10.

Furthermore, the ring washer 320 and the spring washer 330 are inserted into the through part 21 of the anodizing plate 20, and the first releasing prevention washer 340 and the second releasing prevention washer 350 are inserted above the spring washer 330 and stacked thereon.

In addition, the clamp bolt 310 is inserted into the through part 21 through the first releasing prevention washer 340, the second releasing prevention washer 350, the spring washer 330, and the ring washer 320 that are inserted in a stackable manner, and the clamp bolt 310 is fastened to the fastening groove 140 of the inner and outer tab composite nut 100, so that the silicon electrode 10 and the anodizing plate 20 may be tightly connected to each other.

Then, when the inner and outer tab composite nut 100 is inserted into the assembly groove 11 and the anodizing plate 20 is in close contact with the upper portion of the silicon electrode 10, the rotation prevention part 130 protruding above the silicon electrode 10 is inserted into the through part 21. As the rotation prevention part 130 has a polygonal shape, rotation of the inner and outer tab composite nut 100 and the inner and outer tab nut 200 inserted into the silicon electrode 10 can be prevented.

In addition, as the silicon electrode 10 and the anodizing plate 20 are assembled with the rotation prevention part 130 preventing rotation of the inner and outer tab composite nut 100 and the inner and outer tab nut 200, no separate insert is required.

Furthermore, when the rotation prevention part 130 is inserted into the through part 21 of the anodizing plate 20, the gap S, i.e., the empty space, is formed inside the through part 21 and the rotation prevention part 130 is inserted thereinto with an interval, so that separation generated by heat expansion can be prevented.

In addition, when the clamp bolt 310 is fastened to the inner and outer tab composite nut 100, as the first, second releasing prevention washer 340, 350 is provided around the outer portion of the clamp bolt 310, releasing of the clamp bolt 310 can be prevented and the silicon electrode 10 and the anodizing plate 20 can be solidly and stably assembled to each other without being released.

As described above, the present disclosure is not limited to the specific embodiments and description as described above, and ordinary skill in the art to which this invention belongs will appreciate that various modifications, additions and substitutions are possible, without departing from the scope and spirit of the invention as disclosed in the accompanying claims, and the modifications exist in the patent right of the present disclosure.

INDUSTRIAL APPLICABILITY

The present disclosure is configured such that the polygonal rotation prevention part, which is formed on the upper portion of the inner and outer tab composite nut, inserted into the silicon electrode and connected to the clamp bolt to connect the anodizing plate to the silicon electrode, protrudes above the upper portion of the silicon electrode so as to be inserted into and coupled to the anodizing plate. Accordingly, rotation of the inner and outer tab composite nut can be prevented, and a load is minimized by a gap generated in the anodizing plate, so that there is an effect of improving the productivity thereof, and industrial applicability is possible.

The invention claimed is:

1. An interlocking fastening upper electrode assembly having an improved fastening force, the assembly comprising:
    an inner and outer tab composite nut coupled to an assembly groove of a silicon electrode and an anodizing plate so as to prevent rotation;
    an inner and outer tab nut assembled into the assembly groove of the silicon electrode and fitted around the inner and outer tab composite nut; and
    an assembly module coupled through an inner portion of a through part of the anodizing plate and assembled with the inner and outer tab composite nut in order to fix the anodizing plate provided above the silicon electrode,
    wherein the inner and outer tab composite nut comprises: an insertion part inserted into the assembly groove below the inner and outer tab composite nut to be in close contact with an inner surface of the assembly groove; a fastening part extended above the insertion part and comprising a tap so as to be fastened to the inner and outer tab nut; a rotation prevention part located on the fastening part and coupled to the through part of the anodizing plate to prevent rotation of the inner and outer tab composite nut; and a fastening groove having a screw thread so as to allow the assembly module to be fastened through the rotation prevention part, and
    the rotation prevention part protrudes above the silicon electrode and is inserted into the anodizing plate assembled by the assembly module, and the rotation prevention part has an oval shape, or a triangular shape, or a hexagonal shape, or other polygonal shape so as to prevent rotation of the inner and outer tab composite nut, and a gap is generated in the through part to be located around the rotation prevention part, the gap being an empty space remaining after the rotation prevention part is coupled to the through part.

2. The assembly of claim 1, wherein a width of the gap that is the empty space remaining after the rotation prevention part is coupled to the through part is ranged from 0.1 to 0.3 mm.

3. The assembly of claim 1, wherein the inner and outer tab nut comprises a tap on an outer portion thereof so as to be fastened into the assembly groove of the silicon electrode, and
    the inner and outer tab nut has a coupling groove having a screw thread therein so that the inner and outer tab composite nut is coupled thereto through upper and lower ends thereof.

4. The assembly of claim 1, wherein rotation grooves are respectively formed at opposite portions of an upper portion of the inner and outer tab nut so as to allow the inner and outer tab nut to be rotated by a fastening tool.

5. The assembly of claim 1, wherein the assembly module comprises:
    a clamp bolt inserted into the through part of the anodizing plate and fastened to the inner and outer tab composite nut;
    a ring washer provided outside the clamp bolt and fitted into the through part of the anodizing plate;
    a spring washer fitted around the clamp bolt and located above the ring washer; and
    a plurality of a first releasing prevention washer and a second releasing prevention washer that are located above the spring washer and prevent releasing of the clamp bolt.

6. The assembly of claim 5, wherein a plurality of seating grooves is formed on an upper portion of the first releasing prevention washer at predetermined intervals, and a plurality of seating protrusions is provided on a lower portion of the second releasing prevention washer to be seated into the respective seating grooves.

7. The assembly of claim 1, wherein a width of the gap that is the empty space remaining after the rotation prevention part is coupled to the through part is ranged from 0.1 to 0.3 mm.

8. A plasma device comprising an interlocking fastening electrode assembly having an improved fastening force, the electrode assembly coupling an anodizing plate to a silicon electrode,
    wherein the electrode assembly comprises: an inner and outer tab composite nut, an inner and outer tab nut, and an assembly module,
    the inner and outer tab composite nut comprises: an insertion part inserted into an assembly groove of the silicon electrode to be in close contact with an inner surface of a bottom surface of the assembly groove; a fastening part extended above the insertion part and comprising a tap formed on an outer portion thereof; and a rotation prevention part provided on the fastening part and inserted into the through part of the anodizing plate,
    the inner and outer tab nut is fitted around the inner and outer tab composite nut, and assembled to the assembly groove of the silicon electrode,
    the assembly module coupled through an inside space of the through part of the anodizing plate and assembled to the inner and outer tab composite nut, so that the anodizing plate is fixed to the silicon electrode,
    the inner and outer tab composite nut has a fastening groove having a screw thread so as to allow the assembly module to be fastened through the rotation prevention part,
    the rotation prevention part protrudes above the silicon electrode and is inserted into the anodizing plate and has an oval shape, or a triangular shape, or a hexagonal shape, or other polygonal shape so as to prevent rotation of the inner and outer tab composite nut, and a gap is provided in the through part of the anodizing plate to be around the rotation prevention part, and the gap is an empty space remaining after the rotation prevention part is coupled to the through part of the anodizing plate.

9. The plasma device of claim 8, wherein the inner and outer tab nut comprises a tap on an outer portion thereof so as to be fastened into the assembly groove of the silicon electrode, and the inner and outer tab nut comprises a coupling groove having a screw thread formed therein so as to allow the inner and outer tab composite nut to be coupled through upper and lower ends thereof.

10. The plasma device of claim 8, wherein the assembly module comprises:

a clamp bolt inserted into the through part of the anodizing plate and fastened to the inner and outer tab composite nut;

a ring washer provided outside the clamp bolt and fitted into the through part of the anodizing plate;

a spring washer fitted around the clamp bolt and located above the ring washer; and a plurality of a first releasing prevention washer and a second releasing prevention washer that are located above the spring washer and prevent releasing of the clamp bolt.

* * * * *